(12) United States Patent
Uzoh et al.

(10) Patent No.: US 6,337,218 B1
(45) Date of Patent: Jan. 8, 2002

(54) METHOD TO TEST DEVICES ON HIGH PERFORMANCE ULSI WAFERS

(75) Inventors: Cyprian E. Uzoh, Milpitas, CA (US); Stephen A. Cohen, Wappingers Falls; Arnold Halperin, Cortland Manor, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/321,921

(22) Filed: May 28, 1999

(51) Int. Cl.⁷ .............................................. H01L 21/66
(52) U.S. Cl. ........................................ 438/14; 257/780
(58) Field of Search .................. 438/14, 612; 257/773, 257/780; 324/158.1; 356/124; 216/105

(56) References Cited

U.S. PATENT DOCUMENTS

| | | |
|---|---|---|
| 4,158,171 A | 6/1979 | Abbe et al. |
| 4,467,281 A | 8/1984 | Davis et al. |
| 4,766,368 A | 8/1988 | Cox |
| 4,958,129 A | 9/1990 | Poduje et al. |
| 5,182,513 A | 1/1993 | Young et al. |
| 5,189,377 A * | 2/1993 | Rhoades ...................... 324/662 |
| 5,237,271 A | 8/1993 | Hedengren |
| 5,321,352 A | 6/1994 | Takebuchi |
| 5,489,888 A | 2/1996 | Jagiella et al. |
| 5,615,006 A * | 3/1997 | Hirukawa .................... 356/124 |
| 5,719,495 A * | 2/1998 | Moslehi .................... 324/158.1 |
| 5,883,437 A * | 3/1999 | Maruyama ................... 257/773 |
| 6,210,981 B1 * | 4/2001 | Birdsley ......................... 438/9 |
| 6,239,481 B1 * | 5/2001 | Dischiano ................... 257/678 |
| 6,255,599 B1 * | 7/2001 | Chang ......................... 174/255 |
| 6,265,782 B1 * | 7/2001 | Yamamoto ................... 257/783 |

FOREIGN PATENT DOCUMENTS

| | | |
|---|---|---|
| JP | 61171145 | 8/1986 |
| JP | 1073632 | 3/1989 |

* cited by examiner

Primary Examiner—John F. Niebling
Assistant Examiner—Andre C Stevenson
(74) Attorney, Agent, or Firm—Connolly Bove Lodge & Hutz; Joseph P. Abate

(57) ABSTRACT

An apparatus for testing structures in semiconductor wafers. The apparatus includes at least one test probe. At least one tool measures and controls deceleration of the at least one test probe as it approaches a surface of a structure in the semiconductor wafer.

12 Claims, 6 Drawing Sheets

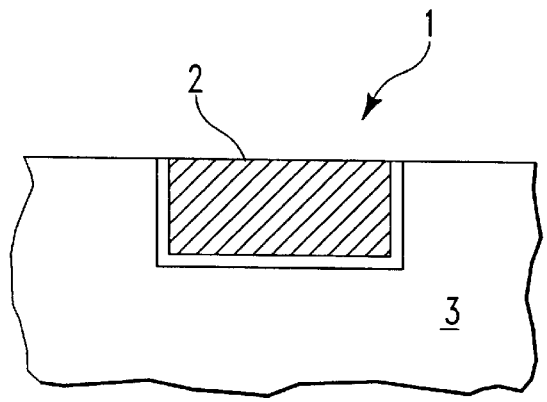
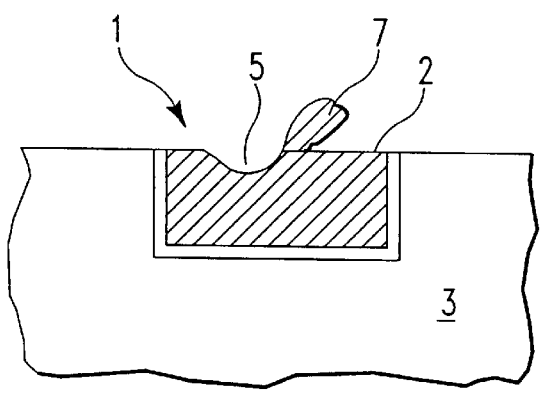
FIG. 1a  FIG. 1b
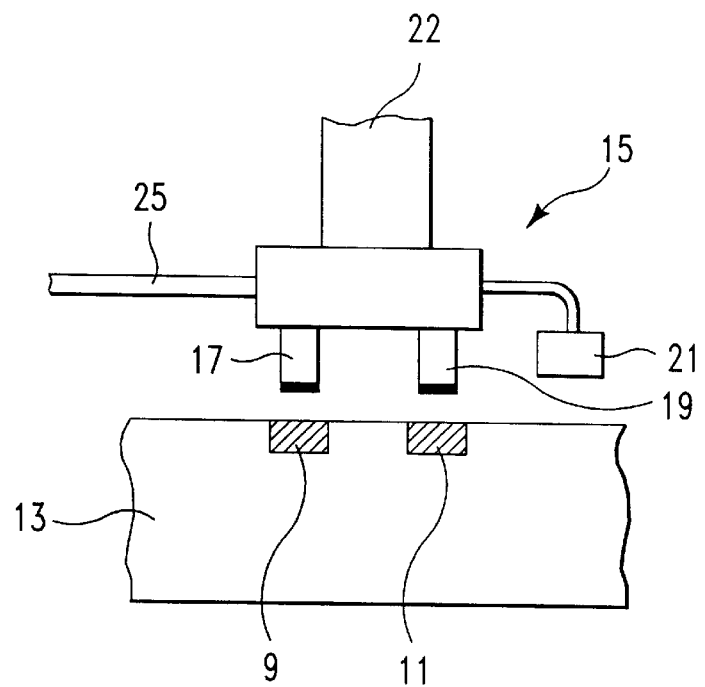
FIG. 2

METHOD TO TEST DEVICES ON HIGH PERFORMANCE ULSI WAFERS

FIELD OF THE INVENTION

The invention relates to a method and apparatus for testing structures in semiconductor wafers.

BACKGROUND OF THE INVENTION

Typically, during the production of semiconductor chips and other electronic devices, testing is carried out to ensure proper functioning of the chips or other devices. In some cases, only particular portions of the chips or other devices may be tested. For example, various structures formed in a semiconductor chip may be tested to ensure proper electrical functioning.

Often, during testing, a probe contacts a structure formed on a semiconductor wafer. Electrical current may then flow through the probe into the structure. As the testing device contacts the structure on the semiconductor wafers, it may actually generate defects in the structures. For example, test probes may impact with a force sufficient to indent and/or scratch test pads on the semiconductor wafers. Also, depending upon the force of the probe tip, insulator cracking may occur. These problems are particularly bad when testing uncapped copper and aluminum structures.

Damage to a test pad or other structure on a semiconductor wafer as a result of contact by a testing probe is often severe enough to cause yield losses at subsequent levels of build. Approaches for addressing damage to structures in semiconductor wafers may involve treating the defects generated by the testing process rather than preventing the defects. According to one method to address test probe related defects, post-test brush cleaning is utilized. According to another method, post-test mild kiss polishing is utilized. According to a third method, the decision is not to test at the intermediate levels, but to defer testing to the final metal level.

Each of the above-described methods for addressing test probe generated defects has associated penalties. Along these lines, deferring testing until the final metal level may result in missing defects that could have permitted the product wafer to be discarded prior to further processing. Alternatively, both cleaning and polishing may result in further damage to the structures that have been damaged during testing as well as to create defects in previously pristine surrounding structures. At a minimum, time and money must be expended to address the above-described problems. Also, the defects can result in waste through their inclusion in the products being tested.

SUMMARY OF THE INVENTION

The present invention provides methods and apparatuses for reducing test related defects. In accordance with these and other objects and advantages, the present invention provides an apparatus for testing structures in semiconductor wafers. The apparatus includes at least one test probe. The apparatus also includes at least one tool for measuring and controlling deceleration of the at least one test probe as it approaches the surface of a structure in the semiconductor wafer.

The present invention also provides a method of testing structures in semiconductor wafers. The method includes directing at least one test probe toward a structure in a semiconductor wafer to retest it. Deceleration of the at least one test probe is detected with at least one tool for measuring and controlling deceleration of the at least one test probe as it approaches a surface of a structure in the semiconductor wafer.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which:

FIG. 1a represents a cross-sectional view of a test pad in a semiconductor wafer prior to testing;

FIG. 1b represents a cross-sectional view of the test pad illustrated in FIG. 1a after testing with a conventional test probe;

FIG. 2 represents an embodiment of an apparatus according to the present invention and a cross-sectional view of a portion of a semiconductor wafer that is to be tested by the apparatus;

DETAILED DESCRIPTION OF THE INVENTION

Figure 3:
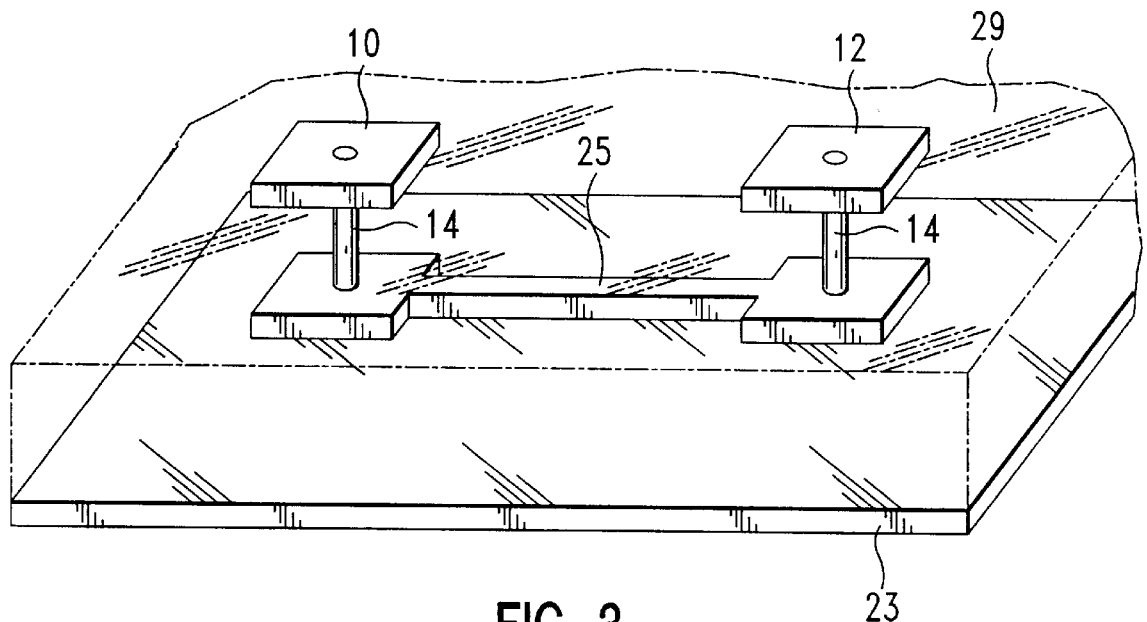
FIG. 3 represents a perspective view of portions of a small section of a semiconductor wafer showing a conduction net.

The present invention provides an apparatus and method for testing structures in semiconductor wafers. The present invention is particularly useful for electrically testing structures made of soft conductors, such as copper, gold, and/or aluminum. However, the present invention may be utilized with any type of structure.

Generally speaking, the present invention may utilize at least one position sensor to detect the location of a probe approaching the surface of the structure to be tested. The present invention may then adjust the deceleration based upon the data detected by the at least one sensor. Additionally or alternatively, the present invention may utilize test probes having planar surfaces that contact the structure to be tested. Whether or not the test probes include a planar surface, the surface of the test probe that contacts the structure to be tested may be coated with a conductive polymer to further avoid damaging soft metal pads or other structures to be tested.

By incorporating the above-described elements into an apparatus, the present invention helps to avoid damage to structures, such as probe pads, during electrical tests. The present invention may also lengthen probe life. Often material is generated when other types of probes push up the surface of the contact, producing loose particles that can move around and cause defects.

By reducing defect generation, the present invention may also extend equipment life and eliminate the need for post-test cleaning, such as the polishing referred to above. Additionally, by preventing the above described problems associated with testing structures in semiconductor wafers, the present invention may increase yield in semiconductor device production processes. Furthermore, the present invention may also decrease cost and time associated in semiconductor manufacturing processes by eliminating the need for additional processes to correct defects generated by testing.

The present invention provides methods and apparatus for reducing test related defects while testing structures in semiconductor wafers using probes that either do not contact the wafer or contact it in such a manner as to cause no damage. It also provides methods and apparatus for making an impedance measurement of a test structure on the wafer.

The distance of the probe to the surface of the wafer may be determined and the distance information used to control the speed at which the probe is moved. This may be accomplished by using an optical sensing method for longer distances and the impedance signal itself for shorter distances. Typically, when the probe is greater than about 1 $\mu$m from the surface of the wafer, the capacitance (Cp.) from the probe to the wafer is very small. This very small capacitance dominates the impedance measurement and is directly proportional to the distance of the probe to the surface of the wafer.

This impedance measurement, proportional to the probe distance, may be utilized to control the speed at which the probe is moved in proximity to the wafer. At large distances, the probe may be moved fast. However, at close distances, the speed may be reduced to accurately position the probe.

Two impedance measurements at two different frequencies may be made on the test structure. By employing the real and complex component values of these two measurements, the test structure resistance and capacitance may be determined. Also, the probe to wafer capacitance may be determined.

The present invention may utilize an optical measurement at longer probe distances and an impedance measurement at shorter distances to measure the probe location with respect to the wafer. Impedance measurements may be made at two frequencies to determine the real and complex values of the electrical circuit under test. The probe contacts may be planar and do not damage the pads on the semiconductor wafer.

FIG. 1a illustrates an example of a test pad 1 arranged in a substrate 3 prior to testing, where the testing includes contacting the test pad surface 2 with a test probe. As described above, contact of the probe with the test pad 1 may damage the test pad. FIG. 1b illustrates a cross-sectional view of an example of damage to a test pad 1 as a result of contact with a test probe tip. As can be seen in FIG. 1b, material 7 has been gouged out of the surface 2 of the test pad 1, leaving a depression 5 in the test pad. In this example, the material 7 gouged out of the test pad 1 remains on the surface 2 of the test pad.

To help prevent damage to the structures in the semiconductor wafer as a result of testing, the present invention includes at least one tool for measuring and controlling deceleration of at least one test probe as it approaches the surface of the structure in the semiconductor wafer.

A probing station according to the present invention may utilize optical sensing, such as an optical interferometer, to bring the probe down to within about 30 $\mu$m of the surface. At that point, with the impedance meter operating at about 1 MHz, the probe to wafer capacitance can be measured. This measurement relates to the distance ($d_{p-p}$) of the probe to the wafer pad.

According to one example, a distance $d_{p-p}$ of about 30 $\mu$m from the probe to the pad relates to a $C_p$ (capacitance from probe to pad) of about 3 $fF$ (femto Farads) when the pad size is about 100 $\mu$m by about 100 $\mu$m and the probe size is comparable. Two probes give a $C_p/2$ of about 1.5 $fF$ which relates to a capacitive reactance of about 100 M$\omega$ at about 1 MHz. and can be resolved by the impedance meter.

According to another example, a $d_{p-p}$ of about 0.1 $\mu$m, resolves to a $C_p/2$ of about 0.5 $fF$ and a capacitive reactance of 350 about k$\omega$. At the distance $d_{p-p}$ of about 0.1 $\mu$m or less, the operating frequency can be lowered to about 10 kHz and measurements of $R_1$ and $C_1$ can be made. Thus, using the circuitry schematically illustrated in FIG. 8B, the reactance of $C_p/2$ would be about 35 M$\omega$ at a $d_{p-p}$ of about 0.1 $\mu$m and an operating frequency of about 10 kHz.

The probe can be driven at high speeds down to about 30 $\mu$m of the surface at which time the probe speed may be reduced and the capacitive sensor will take control of the probe position height sensing.

In addition to altering the rate at which the test probe contacts the structure to be tested, the present invention may include a test probe designed to reduce damage to the structure being tested by the test probe. Along these lines, the surface of the test probe that contacts the structure to be tested may be planar. By including a planar structure rather than a structure that includes a pointed tip or tip that includes at least two surfaces that meet at an angle that contacts the structure being tested, the present invention may help to eliminate gouging of the surface of the structure being testing and the problems associated therewith.

In addition or alternatively to including a planar contact tip, the surface of the test probe that contacts the structure being tested in the semiconductor wafer may be at least partially coated with at least one electrically insulating polymer. The at least one electrically insulating polymer may be softer than the test probe. As a result, the polymer coated test probe may help to prevent damage to the structure being tested.

To control the deceleration of the at least one test probe, the present invention may include an optical and/or a capacitance gauge. The probe can be driven at high speeds down to about 30 $\mu$m of the surface. At that point, the probe speed may be reduced and the capacitive sensor will take control of the probe position height sensing.

Regardless of whether the present invention tests the structures in the semiconductor wafer by contacting them, the present invention may include infrared optics and/or a capacitance gauge to control deceleration of the probe tip into the test pad. Because the distance between the probe and the semiconductor wafer is so small, the position of the probe is near contact. The contact may be so close that it is just in contact with the surface, but with very low pressure, in other words mere contact.

The probe may have an insulating, soft coating that will cause no damage. Also, since the contact may be planar, the force on the wafer surface may be distributed over a wider area. This is not a point contact method. The near contact and non-contact methods can utilize distances below about 0.1 $\mu$m. When an insulating layer is used on the flat side of the probe, the insulation thickness is part of the approximately 0.1 $\mu$m thickness and the probe insulation may be in contact with the wafer pad.

FIG. 2 illustrates an example of an embodiment of a device according to the present invention. FIG. 2 illustrates two structures to be tested 9 and 11 in a substrate 13, such as a semiconductor wafer.

The embodiment of the present invention illustrated in FIG. 2 includes the apparatus for testing structures in semiconductor wafers 15. The apparatus includes two test probes 17 and 19.

The apparatus 15 also includes a capacitance positioning sensor 21 for measuring the position of the apparatus 15 and the rate at which it approaches the structures to be tested 9 and 11. The capacitance positioning sensor may sense the gap between the tips of probes 17 and 19 and the top surface of the structures to be tested 9 and 11. The capacitance positioning sensor may also detect the lateral position of the apparatus 15 with respect to the semiconductor wafer that includes the structures to be tested.

The tester may include a ground plane to reduce capacitance between neighboring pads. The reason to use a grounded plane 6 in close proximity to the module is to lower the effective capacity of $C_{1-2}$. Normally, the capacity of the various parts of the net to the other parts in the module such as $C_{1-3}$ and then back to another part of the net such as $C_{2-3}$ add to the value of $C_{1-2}$. The capacity $C_{3-6}$ may be much larger than the net capacities $C_{1-3}$ and $C_{2-3}$. This may act like a divider of the capacities and reduce the effective capacity across the net.

The apparatus may be supported on a support 22. Also, the apparatus may include a connection 25 for connecting the apparatus to a power source and/or a processor, among other things.

FIG. 3 illustrates a conductive net and an insulated power plane in a semiconductor wafer. Surface pads 10 and 12 at the end of the conducting net are exposed. Other parts of the net and wafer including the power/ground planes 23 are covered with insulation 29 to protect the devices and lines and prevent shorting. A via 14 connects the surface pad 10 to the conducting line 25.

Figure 4:
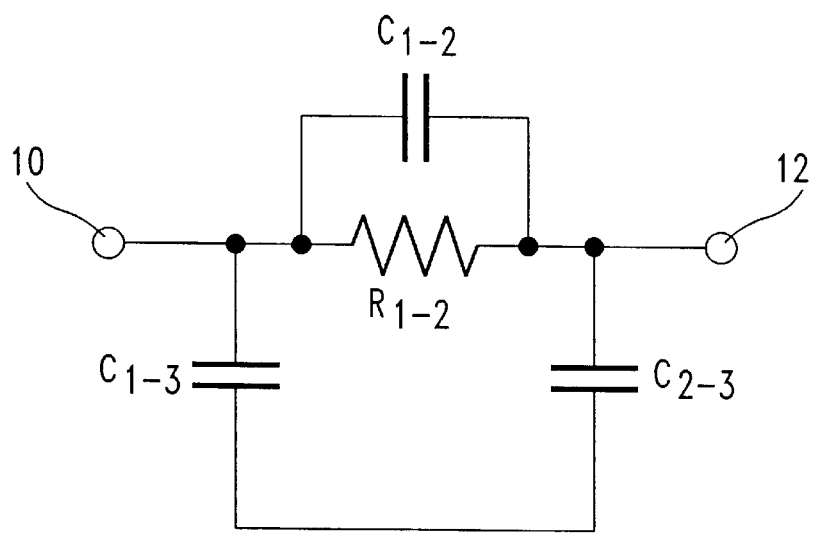
FIG. 4 represents a schematic illustrating an electrical equivalent circuit of the elements shown in FIG. 3.

FIG. 4 shows a schematic drawing illustrating the electrical equivalent for the simplified view shown in FIG. 3. As such, FIG. 4 illustrates a conducting path between pad 10 and pad 12 shown by resistor $R_{1-2}$. There is a stray, or undesired, capacitance across these pads and resistance as shown by capacitance $C_{1-2}$. $C_{1-3}$ and $C_{2-3}$ represent the capacitance from each pad to the power planes in the wafer.

Figure 5:
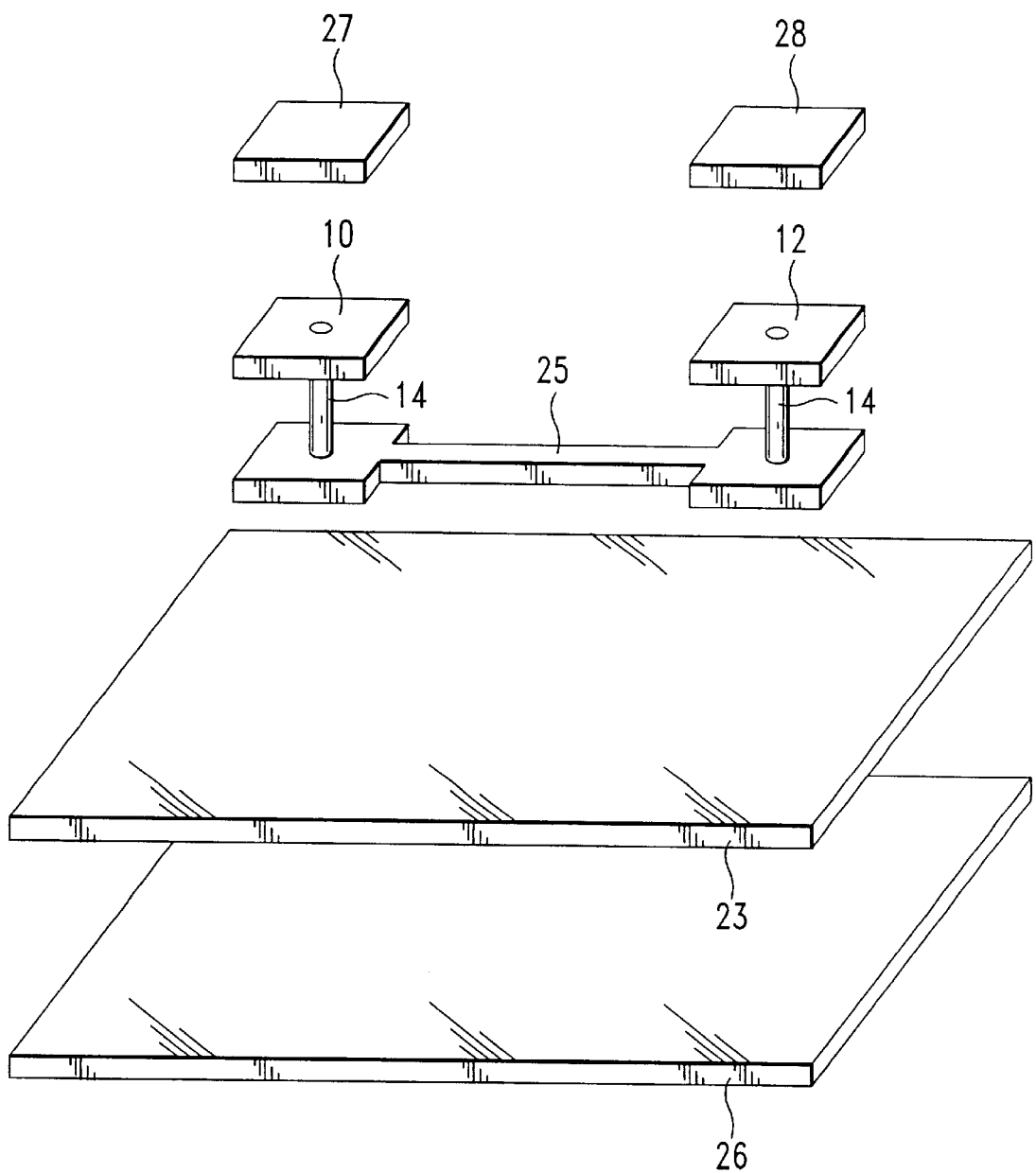
FIG. 5 represents a perspective view of portions of a small section of a semiconductor wafer showing a conduction net with a grounded plane that couples electrically to power planes in the semiconductor wafer.

FIG. 5 shows a simplified view of the wafer under test with probes 27 and 28 coming to close proximity to the surface pads 10 and 12. A grounded external plane 26 is shown in proximity to the wafer under test. The ground plane 26 will have a large capacitance to the power plane 23 inside the wafer.

A reason to use a grounded plane 26 in close proximity to the module is to lower the effective capacity of $C_{1-2}$. Typically, the capacity of the various parts of the net to the other parts in the module, such as $C_{1-3}$ and then back to another part of the net, such as $C_{2-3}$, adds to the value of $C_{1-2}$. The capacity $C_{3-6}$ is much larger than the net capacities $C_{1-3}$ and $C_{2-3}$. This acts like a divider of the capacities and reduces the effective capacity across the net.

Figure 6:
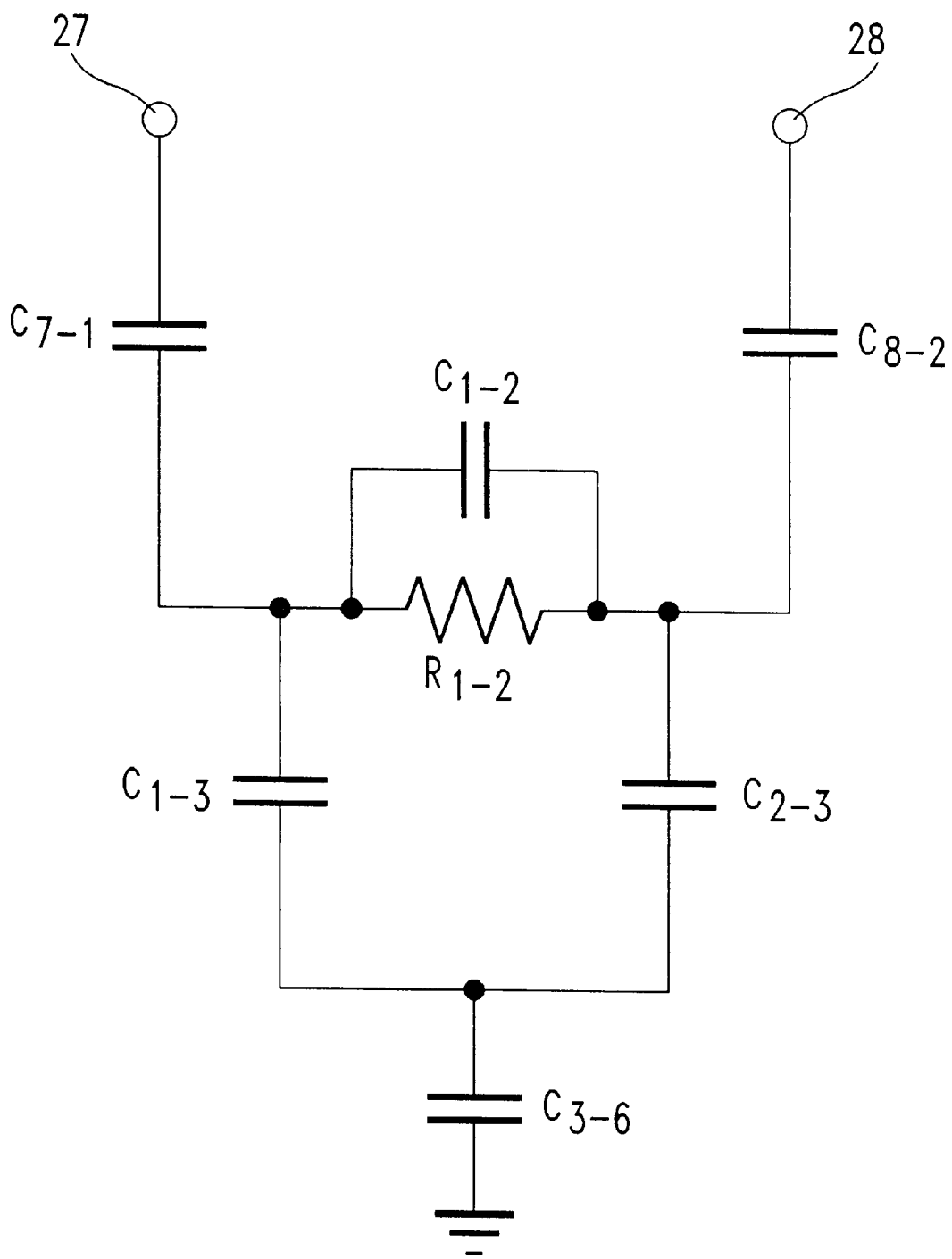
FIG. 6 represents a schematic illustrating an electrical equivalent circuit of the elements of the semiconductor wafer with the grounded plane shown in FIG. 3.

FIG. 6 shows the electrical circuit equivalent for the arrangement illustrated in FIG. 5. As such, FIG. 6 shows the probe to pad capacitance $C_{7-1}$ and $C_{8-2}$ and the power plane to external ground capacitance $C_{3-6}$.

Figure 7:
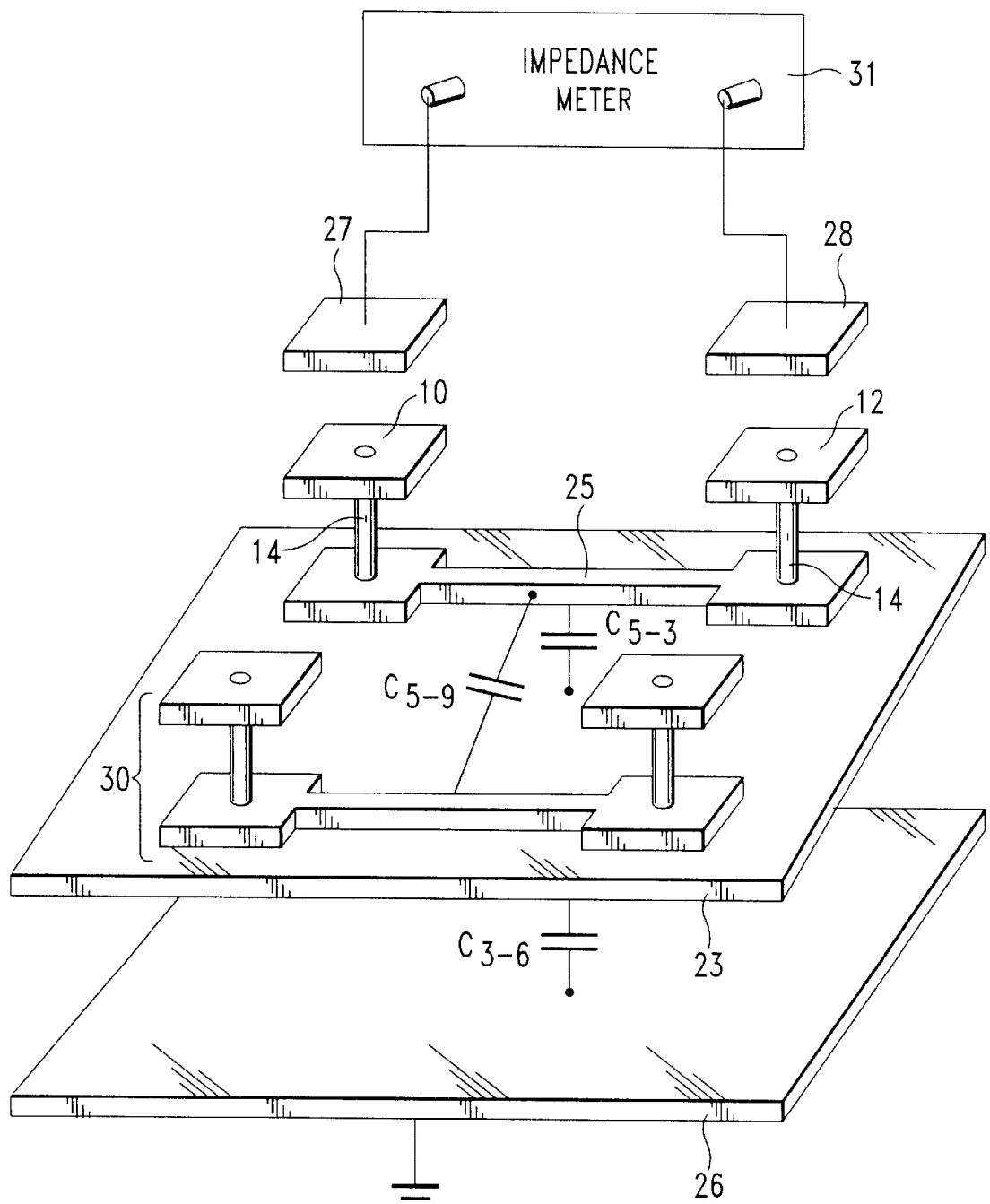
FIG. 7 represents a perspective view of portions of a small section of a semiconductor wafer showing a second conducting line, an impedance meter and a grounded plane, as well as schematic elements representing an electrical equivalent circuit.

FIG. 7 shows an embodiment of an arrangement according to the present invention where an impedance meter 31 is connected to two probes 27 and 28. The probes are shown in proximity to the circuit pads 10 and 12, which are part of the net under test. FIG. 7 also shows another circuit line 30 and the capacities from the circuit under test to that line 30 and the power plane 23. The capacity from the power plane 23 to the externally grounded plane 26 is shown as $C_{3-6}$.

Figure 8A:
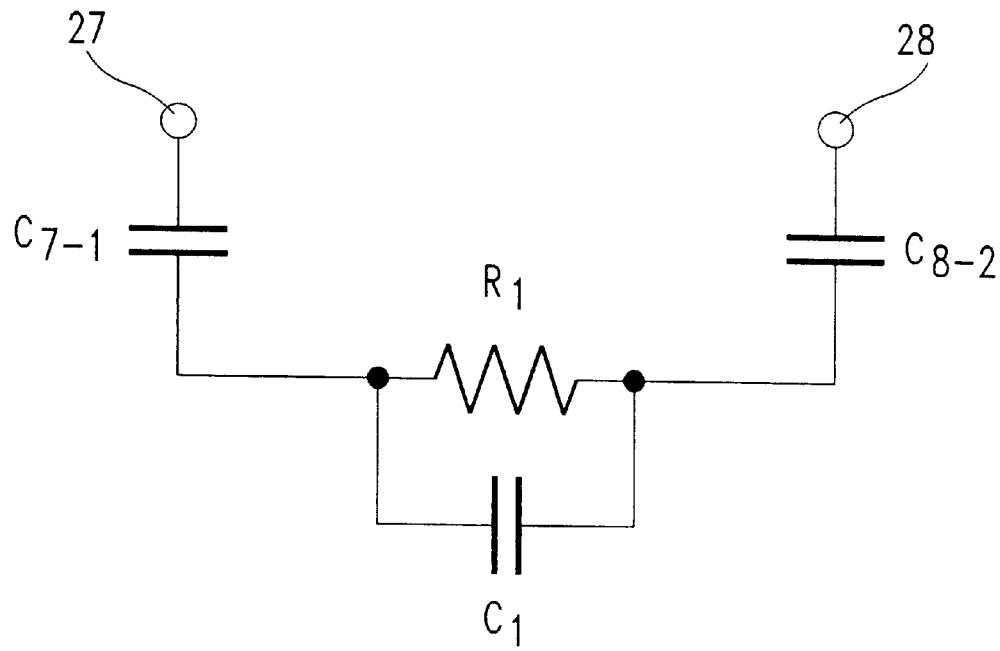
FIG. 8A and FIG. 8B represent schematics of reduced electrical equivalent circuits of a circuit under test in FIG. 7.

FIG. 8A shows a simplified schematic electrical equivalent circuit of the arrangement illustrated in FIG. 7, where $C_1$ includes $C_{1-2}$ and all the shunt capacities, such as $C_{1-3}$ and $C_{2-3}$. $C_{7-1}$ and $C_{8-2}$ are the probe to pad capacitance. $R_1$ is the equivalent of $R_{1-2}$ from the previous figures.

Figure 8B:
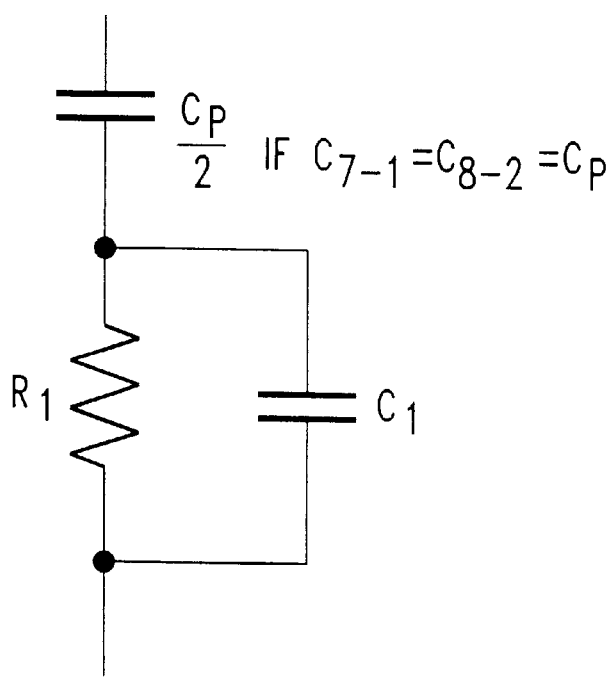

FIG. 8B shows an equivalent of the simplified network illustrated in FIG. 8A where the probe to pad capacities are combined into an equivalent capacitance $C_p/2$. These circuit equivalents may make the mathematical equations easier to work with.

The present invention may utilize an impedance method for testing the structures in the semiconductor wafers. According to an impedance method, multiple frequencies typically should be utilized in testing the structures. Along these lines, frequencies of about 10 kHz, about 20 kHz, and about 5 kHz may be utilized.

Because the distance is so small, the position of the probe is near contact. It may be so close that it is just in contact with the surface, but with very low pressure (mere contact). The probe may have an electrically insulating soft coating that will cause no damage. Also, since the contact may be planar, the force on the wafer surface may be distributed over the wider area. The present invention typically is not thought of as a point contact method. The near contact and non-contact methods according to the present invention utilize distances below about 0.1 $\mu$m. When an insulating layer is used on a flat side of a probe, the insulation thickness may be considered to form a part of the about 0.1 $\mu$m thickness. Therefore, the probe insulation may be in contact with the wafer pad.

Measurements taken during the testing have been plugged into the following equations. In considering the circuitry represented in FIG. 8B, in order to resolve the net resistance $R_1$, the composite capacitance $C_1$, and the probe to net capacitance $C_p$, three equations typically are needed because there are three unknown values to be determined. When an impedance meter having a real and complex value is used to take measurements, only two measurements typically are needed to produce the three values for the three equations. The equations may be derived from the simplified circuit shown in FIG. 8B. This circuit impedance is:

$$Z_1 = \frac{R_1}{1+(\omega C_1 R_1)^2} - j\frac{1}{1+(\omega C_1 R_1)^2}\left[(R_1)^2 \omega C_1\left(1+\frac{2C_1}{C_P}\right)+\frac{2}{\omega C_P}\right]$$

This equation includes a real part A and a complex part B as shown below:

Z=A−jB

When a frequency is applied to the circuit through an impedance meter such as an H.P. precision LCR meter, the real part A and the complex part B values are obtained. For a frequency $f_1$ giving an angular frequency $\omega_1=2\pi f_1$, the real part of the impedance is:

$$\text{Re } Z_{f_1} = A_1 = \frac{R_1}{1+(\omega_1 R_1 C_1)^2}$$

The complex part is:

$$\text{Im} Z_{f_1} = B_1 = \frac{(R_1)^2 \omega_1 C_1 \left(\frac{1+2C_1}{C_P}\right) + \frac{2}{\omega_1 C_P}}{1+(R_1 \omega_1 C_1)^2}$$

If a frequency $f_2$ is used, the real part of the impedance is:

$$\text{Re } Z_{f_2} = A_2 = \frac{R_1}{1+(\omega_2 R_1 C_1)^2}$$

Thus, three equations are obtained by using two angular frequencies, $\omega_1$ and $\omega_2$ and the three unknowns, $R_1$, $C_1$, and $C_p$, can be determined when these three equations are solved and are shown as:

$$R_1 = \frac{A_1 A_2 [(\omega_2)^2 - (\omega_1)^2]}{A_2 (\omega_2)^2 - A_1 (\omega_1)^2}$$

$$C_1 = \frac{[(A_1 - A_2)(A_2(\omega_2)^2 - A_1(\omega_1)^2)]^{1/2}}{A_1 A_2 [(\omega_2)^2 - (\omega_1)^2]}$$

$$C_P = \frac{2[(\omega_1 R_1 C_1)^2 + 1]}{\omega_1 B_1 + (\omega_1 R_1)^2 C_1 (\omega_1 B_1 C_1 - 1)}, \text{ (In terms of } R_1 \text{ and } C_1\text{)}$$

The test typically should then be repeated. The test typically requires obtaining the real value acquired by the impedance test at two frequencies and the complex value of the impedance test at one frequency.

Advantages of the present invention include the ability to detect "opens" and shorts in structures in semiconductor wafers without contacting the structures to be tested. The present invention also provide maze resistance data where convoluted comb and serpentine structures are used to test wiring reliability. The present invention may eliminate probe damage to structures in semiconductor wafers as well as to structures in the wafers other than the structures being tested.

The present invention may also increase probe life by limiting contact or altering the nature of the contact between the test probe and the structures to be tested in a semiconductor wafer. Along these lines, the present invention may also minimize probe tip resurfacing as required to compensate for probe wear. The present invention may also be utilized for chip level or package level platform testing. The present invention may also simplify the process of testing the structures in semiconductor wafers.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. An apparatus for testing structures in semiconductor wafers, comprising:
   at least one test probe;
   means coupled to said at least one test probe for measuring impedance of said structures; and
   at least one tool for measuring and controlling deceleration of the at least one test probe as it approaches a surface of a structure in the semiconductor wafer.

2. The apparatus according to claim 1, wherein the structure being tested is metallic.

3. The apparatus according to claim 1, wherein the at least one tool includes at least one member selected from the group consisting of infrared optics and a capacitance gauge.

4. The apparatus according to claim 1, wherein a surface of the test probe contacts the surface of the structure to be tested, and wherein the contact surface of the test probe is coated with at least one electrically conducting polymer.

5. The apparatus according to claim 1, wherein a surface of the test probe that contacts the surface of the structure to be tested is planar.

6. The apparatus according to claim 1, wherein the at least one test probe tests the structures in the semiconductor wafers without contacting them.

7. A method of testing structures in semiconductor wafers, the method comprising the steps of:
   directing at least one test probe towards a semiconductor wafer;
   detecting deceleration of the at least one test probe with at least one tool for measuring and controlling deceleration of the at least one test probe as it approaches a surface of a structure in the semiconductor wafer; and
   measuring the impedance, at least one frequency, of at least one structure in said semiconductor wafer.

8. The method according to claim 7, wherein the structure being tested is metallic.

9. The method according to claim 7, wherein the at least one tool includes at least one member selected from the group consisting of infrared optics and a capacitance gauge.

10. The method according to claim 7, wherein a surface of the test probe contacts the surface of the structure to be tested, and wherein the contact surface of the test probe is coated with at least one electrically conducting polymer.

11. The method according to claim 7, wherein a surface of the test probe that contacts the surface of the structure to be tested is planar.

12. The method according to claim 7, wherein the at least one test probe tests the structures in the semiconductor wafers without contacting them.

* * * * *